United States Patent
Shander (10) Patent No.: US 6,822,458 B2
(45) Date of Patent: Nov. 23, 2004

(54) APPARATUS AND METHOD FOR SIMULATING ARCING

(75) Inventor: Mark S. Shander, Lynnwood, WA (US)

(73) Assignee: The Boeing Company, Chicago, IL (US)

(*) Notice: Subject to any disclaimer, the term of this patent is extended or adjusted under 35 U.S.C. 154(b) by 3 days.

(21) Appl. No.: 10/417,240

(22) Filed: Apr. 17, 2003

(65) Prior Publication Data

US 2004/0207407 A1 Oct. 21, 2004

(51) Int. Cl.[7] ............................................. G01R 31/12
(52) U.S. Cl. ........................ 324/536; 324/509; 324/424
(58) Field of Search ...................... 218/67, 156; 324/95, 324/422, 424, 509, 536; 335/6; 361/2, 93.1, 152

(56) References Cited

U.S. PATENT DOCUMENTS

| | | | | |
|---|---|---|---|---|
| 4,334,318 A | * | 6/1982 | Klank et al. | 455/195.1 |
| 4,658,332 A | | 4/1987 | Baker et al. | 361/37 |
| 4,988,925 A | * | 1/1991 | Biblarz | 315/334 |
| 5,121,282 A | | 6/1992 | White | 361/42 |
| 5,682,101 A | | 10/1997 | Brooks et al. | 324/536 |
| 5,805,397 A | | 9/1998 | MacKenzie | 361/42 |
| 5,825,598 A | | 10/1998 | Dickens et al. | 361/42 |
| 5,834,940 A | | 11/1998 | Brooks et al. | 324/424 |
| 5,963,405 A | | 10/1999 | Engel et al. | 361/42 |
| 6,034,611 A | | 3/2000 | Brooks et al. | 340/647 |
| 6,072,673 A | * | 6/2000 | Chen et al. | 361/9 |
| 6,195,241 B1 | | 2/2001 | Brooks et al. | 361/42 |
| 6,242,993 B1 | | 6/2001 | Fleege et al. | 335/18 |
| 6,246,556 B1 | | 6/2001 | Haun et al. | 361/42 |
| 6,300,766 B1 | | 10/2001 | Schmalz | 324/536 |
| 6,313,642 B1 | | 11/2001 | Brooks | 324/547 |
| 6,370,001 B1 | * | 4/2002 | Macbeth | 361/170 |
| 6,452,767 B1 | | 9/2002 | Brooks | 361/42 |
| 6,456,471 B1 | | 9/2002 | Haun et al. | 361/42 |

OTHER PUBLICATIONS

Schneider Electric Data Bulletin 0760DB0204, "Determining the Cause of AFCI Tripping", Jun. 2003.
Electric Device Corporation "GF Series FGI/AFCI Test Systems", Oct. 2002.
ARC–Fault Circuit–Interrupters—UL 1699, "Carbonized path Arc Clearing Time Test", pp. 33–34, Dec. 2, 2000.
ARC–Fault Circuit–Interrupters—UL 1699, "Operation Inhibition Tests", pp. 40–44, Dec. 2, 2000.

* cited by examiner

Primary Examiner—Anjan Deb
Assistant Examiner—Walter Benson
(74) Attorney, Agent, or Firm—Baker & Hostetler LLP (57) ABSTRACT

An apparatus and method for simulating arcing events for use in testing arc fault circuit interrupters. The apparatus and method utilizes a plurality of motion sensitive switches, for example, mercury switches or ball-tilt switches, secured within the housing. When the apparatus is moved the switches interrupt a current flow mimicking arcing events.

20 Claims, 7 Drawing Sheets

APPARATUS AND METHOD FOR SIMULATING ARCING

FIELD OF THE INVENTION

The present invention relates generally to electrical testing devices. More particularly, the present invention relates to devices for simulating arcing conditions for testing devices such as arc fault circuit interrupters.

BACKGROUND OF THE INVENTION

Arcing in electrical circuits results when electricity discharges from an area of high voltage potential to an area of lower voltage potential across a conductive path. Series type arcing is the low level arcing events that are generally caused by loose or dirty contacts, low contact pressure, or breaks in wire lengths. For example, a break in a wire caused by it being hit by a nail can cause arcing from one side of the broken wire to the other across the air gap. Series type electrical arcing can also result at the point of connection of wires where the connection is corroded or improperly installed.

Figure 1:
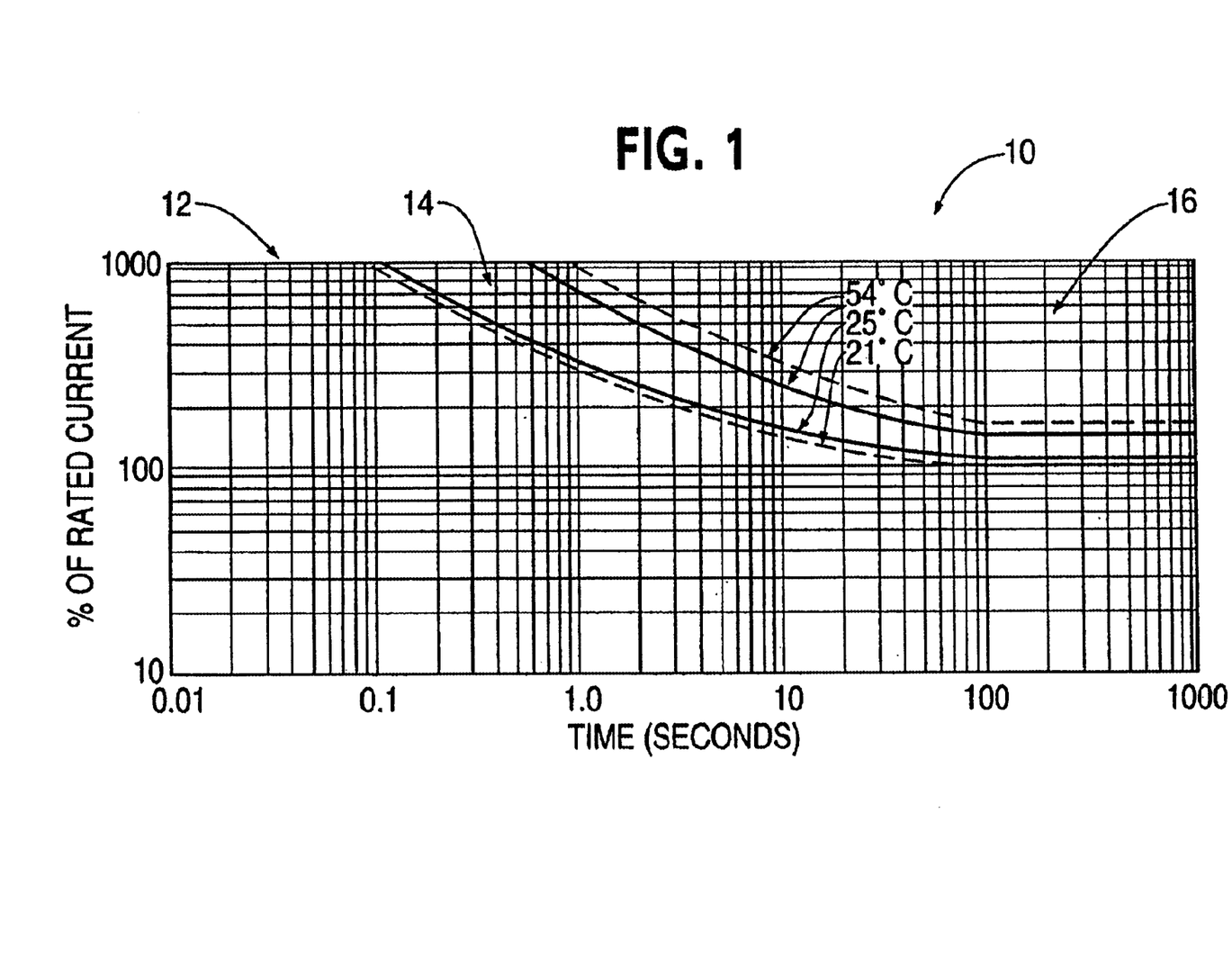
FIG. 1 is a graph depicting the trip characteristics of an exemplary circuit breaker or fuse.

Some protection against arcing is provided by over current protection devices such as circuit breakers or fuses. As depicted in FIG. 1 a graph 10 of the trip characteristics of an exemplary circuit breaker or fuse is provided. As depicted, the graph 10 is divided generally into a must hold region 12, a may trip region 14, and a must trip region 16.

In the must hold region 12 the circuit breaker or fuse will not trip even if the current exceeds the rated current of the circuit protection device as long as the duration of such over current is sufficiently short. For example, if the current is seven times the rated current for less than two tenths of a second, the device will not trip.

In the must trip region 16, the circuit protection device will always trip when the current exceeds the rated current for a sufficiently long duration. For example, when the current exceeds six times the rated current for one second or more the device must trip.

In between the must hold region 12 and must trip region 16 the circuit protection device may or may not trip. It is noted that the performance of such circuit protection devices is temperature dependent and thus the upper and lower boundaries drift upward as the temperature drops, i.e., the same over current condition must exist for a longer period in order for the device to trip. Conversely, the boundaries drift downward as the temperature rises.

Arcing conditions that exist in the must trip region 16 will be protected against by typical circuit breakers and fuses: However, most arcing occurs in the must hold region and thus, these devices do not protect against most arcing conditions.

Protection is also provided, to some extent, by ground fault circuit interrupters which can detect current leakage to ground. Particularly, ground fault circuit interrupters detect differentials in the current flow through the hot and neutral wires. Where a difference exists in current flow through both wires above a set threshold, as would exist where electricity is arcing from the hot wire to a neighboring surface, the circuit is interrupted. Ground fault circuit interrupters are also not particularly effective, however, at detecting series type arcing events where no current path exists to ground.

Arc fault circuit interrupters do provide significant protection against damage caused by series type arcing. These devices utilize discrete electronics to monitor and analyze fluctuations in the current in a circuit and interrupt the circuit if an unwanted arc is detected. Because there is arcing which occurs normally in circuits, such as when a light switch is operated, the algorithms used to analyze the current fluctuations in arc fault circuit interrupters allow these devices to detect and react only to unwanted arcing events. Because of their efficacy, the 2002 National Electrical Code now mandates use of arc fault circuit interrupters for new home construction.

With the development of arc fault circuit interrupters, there is a consequent need for arc fault circuit interrupter test devices. This is particularly true for arc fault circuit interrupters used in applications such as aircraft circuitry. A number of such test devices have therefore been developed which simulate series type arcing.

An example of such a device is the opposed carbon rod series arc detector which is described in the Underwriters Laboratory specification UL 1699. In this type of device, a test starts with two carbon electrodes in physical contact with each other, completing an electrical circuit. The circuit is energized and current is allowed to flow through the carbon electrodes. With one electrode held fixed, the other electrode is slowly drawn away from the first, thus producing a sustainable series arc.

Drawbacks of these types of devices include the exposed arc which contains lethal voltage/current levels, produces ultraviolet light, noxious fumes, and intense light. The high temperatures caused by the arcs are also an ignition source for flammable and explosive materials around the test device.

Another drawback of this type of device is that it produces an arc that does not mimic the randomness associated with series arcing caused by loose or dirty contacts, low pressure, or breaks in wire lengths. Further, the electrodes used in these devices deteriorate with use causing uncontrolled variation of the arcing profile.

Another type of testing device that has been developed utilizes vibrating loose terminals to simulate series type arcs. In this type of device, an electrical terminal strip is attached to a vibration table and wires with crimped rings are loosely attached to the terminal strip by placing the rings around conductive posts protruding from the terminal strip. When the circuit is energized, and the table is vibrating, the loose terminals begin to arc randomly.

Because this type of device generates exposed arcs, it suffers the same drawbacks described above with respect to the exposed arc of the opposed carbon rod series arc generator. In addition, the vibrating loose terminal testing device suffers the problem of precise alignment of the terminals being necessary to initiate arcing.

Vibrating loose terminal test devices are costly to build owing to the use of expensive equipment, a vibration table. These devices are also costly to operate because the oxidation which occurs on the ring terminals and terminal strip requires these components to be replaced at the start of each test.

A third type of existing arc fault circuit interrupter test device generates arcs using electronic components such as silicon controlled rectifiers, field effect transistors, and solid state relays. In these devices, random half cycles of current are switched out to mimic arcing events. The drawbacks of these devices are that no actual arcing occurs and thus the test is not representative of real arcing events.

Accordingly, it is desirable to provide an apparatus and method for simulating series type arcing events that does not generate exposed arcs and thus does not have parts subject to oxidation. It is also desirable that such an apparatus and method generate actual arcs so that real arcing events are simulated.

SUMMARY OF THE INVENTION

The foregoing needs are met, to a great extent, by the present invention, wherein in one aspect an apparatus is provided that in some embodiments simulates an arcing event in a circuit using motion sensitive switches secured in an housing which is moveable in a plane. Movement of the housing causes current disruptions within the switches which mimic arcing events.

In accordance with one aspect of the present invention, an arc simulating apparatus is provided having a housing. A number of motion sensitive switches are connected in series and secured within the housing. A first terminal wire is connected to a first pole of the series circuit of switches and a second terminal wire is connected to a second pole of the series circuit of switches.

In accordance with another aspect of the invention, a method of simulating an arc in a circuit is provided wherein a housing containing a series connection of a number of motion sensitive switches is moved in order to interrupt a current flow in a circuit containing an arc fault circuit interrupter.

In yet another aspect of the invention, an apparatus for simulating an arc is provided wherein a plurality of means for interrupting a circuit in response to movement are connected in series. Means are provided for securing the series connection of the plurality of circuit interrupting means, the securing means being moveable in a plane. A first means is provided for electrically connecting the plurality of circuit interrupting means to a circuit to be tested. A second means for electrically connecting the plurality of circuit interrupting means to a circuit to be tested is also provided.

There has thus been outlined, rather broadly, certain embodiments of the invention in order that the detailed description thereof that follows herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

The invention will now be described with reference to the drawing figures, in which like reference numerals refer to like parts throughout. An embodiment in accordance with the present invention provides a housing having a base moveable in a plane. A plurality of motion sensitive switches, for example, mercury switches or ball-tilt switches, are secured within the housing. The switches are distributed radially within the housing and are secured at an angle to the base such that movement of the housing in the plane causes the switches to interrupt a current flow mimicking series arcing events.

Figure 2:
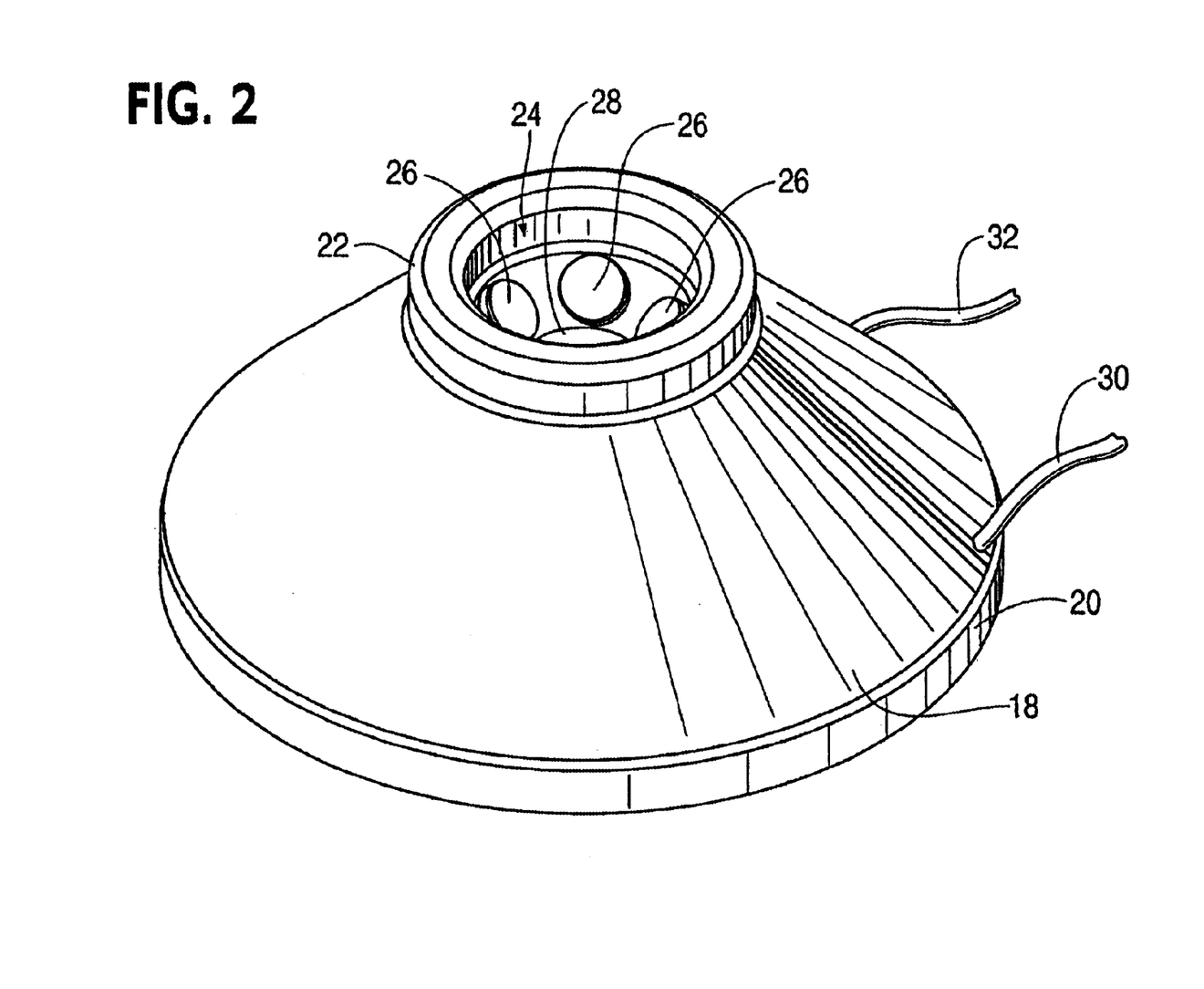
FIG. 2 is a perspective view of an arc simulating device in accordance with a preferred embodiment of the invention.

An embodiment of the present inventive apparatus is illustrated in FIG. 2 wherein an arc simulator is depicted having a housing 18. The housing 18 is provided with a base 20 and an upper rim 22. A recessed area 24 is provided at the top of the housing into which a plurality of motion sensitive switches 26, secured within the housing, protrude. A bubble level 28 is also provided in the recessed portion 24 to allow leveling of the housing on a plane in which it will be moved.

In an exemplary embodiment the motion sensitive switches 26 are twenty five amp mercury switches. It should be understood, however, that other types of motion sensitive switches, such as ball-tilt switches, can be substituted in the present invention to achieve the functionality herein described. It is noted that an advantage of using mercury switches in this device is that it eliminates switch bounce associated with mechanical switching.

As will be described in more detail below, the switches 26 are connected in series with a first end of the series connection terminating with a first terminal wire 30. The other end of the series connection of switches terminates in a second terminal wire 32. The terminal wires 30, 32 are used to connect the arc simulating device to a circuit having an arc fault circuit interrupt device to be tested.

In an exemplary embodiment of the invention, the housing 18 is provided in an inverted funnel shape which allows it to be easily held by a user. It should be understood that this shape is not essential to the operation of the arc simulator and that the housing could be provided in other shapes that can be easily handled or could be provided with appendages, such as handles, for grasping the housing 18.

Figure 3:
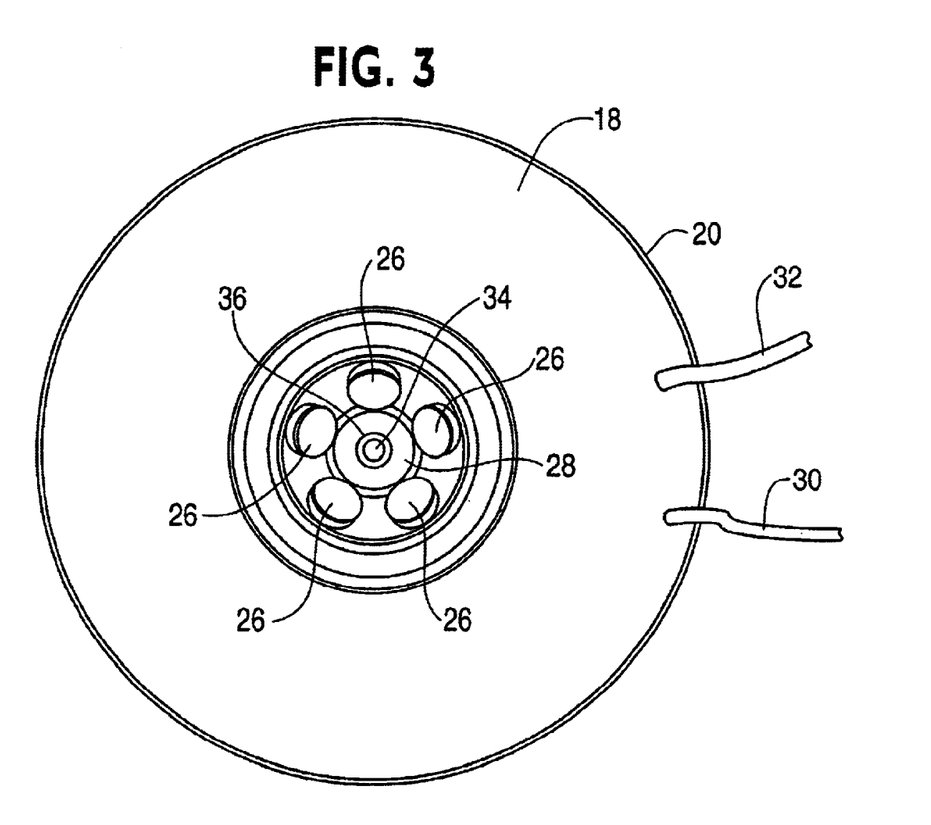
FIG. 3 is a top plan view of the arc simulating device of FIG. 2.

As depicted in the top view of the arc simulator shown in FIG. 3 five switches 26 are secured within the housing and are distributed radially through 360 degrees. The bubble level 28 is provided with a floating colored bubble 34 indicating a level position when it is located within a leveling ring 36 on the bubble level.

Figure 4:
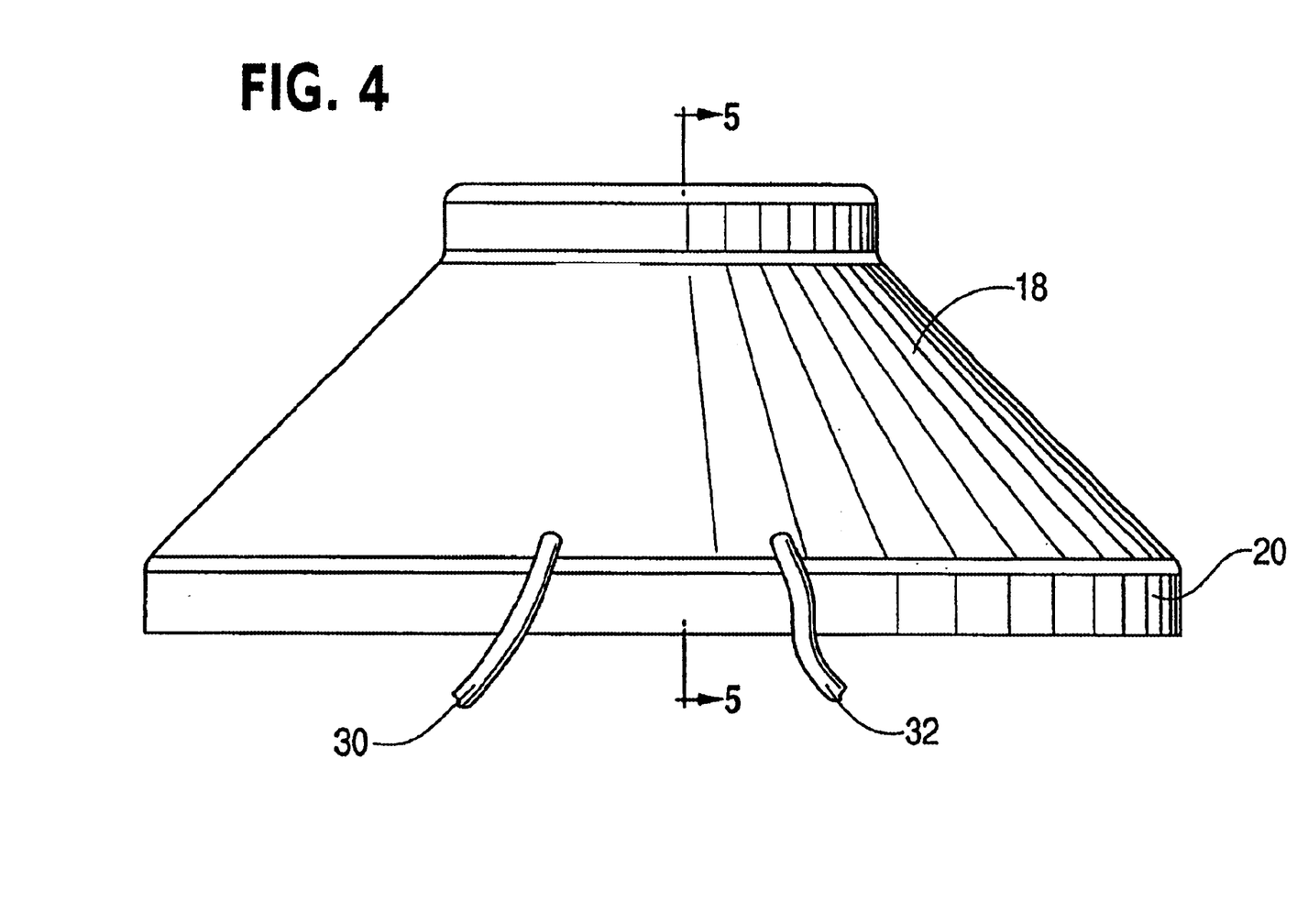
FIG. 4 is a side plan view of the arc simulating device of FIG. 2.

The inverted funnel shape of the arc simulator housing of the exemplary embodiment can also be seen in the side view provided in FIG. 4. So that the operation of the arc simulator can be better understood, a sectional view, taken along the line 5—5 of FIG. 4 is provided in FIG. 5.

Figure 5:
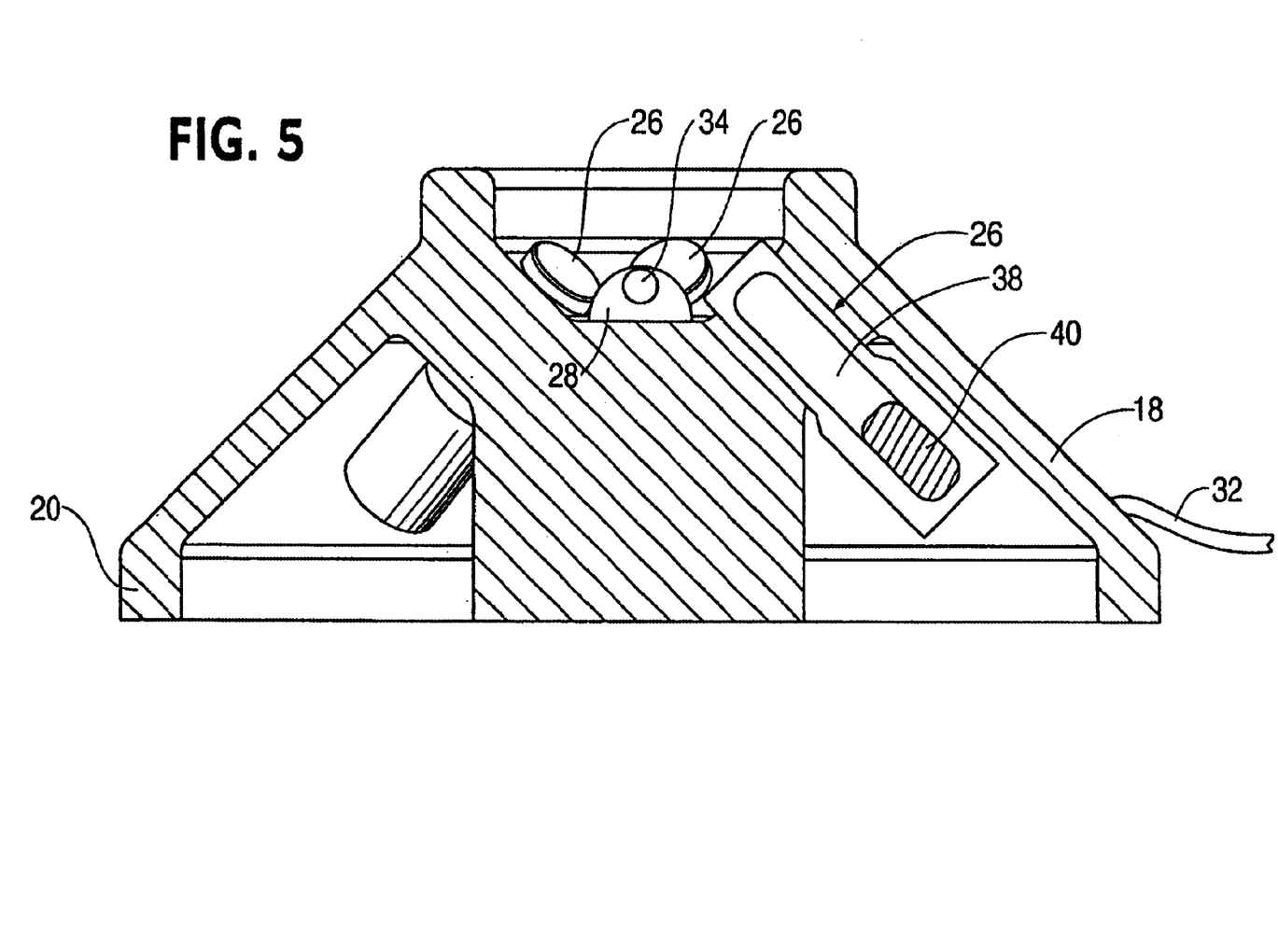
FIG. 5 is a cross-sectional view of the arc simulating device taken along the 5—5 in FIG. 4.

As depicted in FIG. 5, a sectional view of the housing 18 is shown along with a sectional view of one of the switches 26. As depicted, the housing 18 is a hollow structure into which the switches 26 are secured at an angle to the plane on which the base 20 rests. A housing 18 as depicted, having the switches 26 secured therein, can be readily manufactured in one piece, or in components to be assembled, using known injection molding processes. Alternatively, the housing can be machined in separate pieces and the switches 26 secured therein. The housing can be constructed from any material although it is anticipated that a non-conducting material will be used for this purpose.

As shown in the sectional view of the switch 26 of FIG. 5, the switch contains a hollow area 38 having a quantity of mercury 40 contained therein. It should be readily understood that each of the switches 26 contains a pair of terminals in the base which are electrically connected through the mercury 40 while the switch is at rest. One of the terminals in the base of the depicted sectional switch is connected to the terminal wire 32. As will be explained below, the other terminal of the depicted sectional switch is connected, by a wire, to the terminal in an adjacent switch.

It should be readily understood from FIG. 5 that when the housing is at rest on a level planar surface, the mercury switches maintain continuity between the input and output terminals of the arc simulator. As the housing is moved by a user on a level plane the mercury in the switches 26 will move. Depending on the direction and speed of movement, the mercury in one or more of the switches 26 will be displaced sufficiently from the base of the hollow portion 38 to cause an electrical disconnect between the terminals inside the switch.

Through selection of the number of switches 26, their radial location in the housing 18, and the angle of the switches 26 with respect to the level plane on which the base 20 rests, different arcing sensitivities can be simulated. In an exemplary embodiment, five switches are evenly distributed and mounted at an angle greater than thirty degrees to the base plane. In this arrangement minimal displacement of the mercury in the switches occurs thereby limiting the duration of any circuit interruption.

Figure 6:
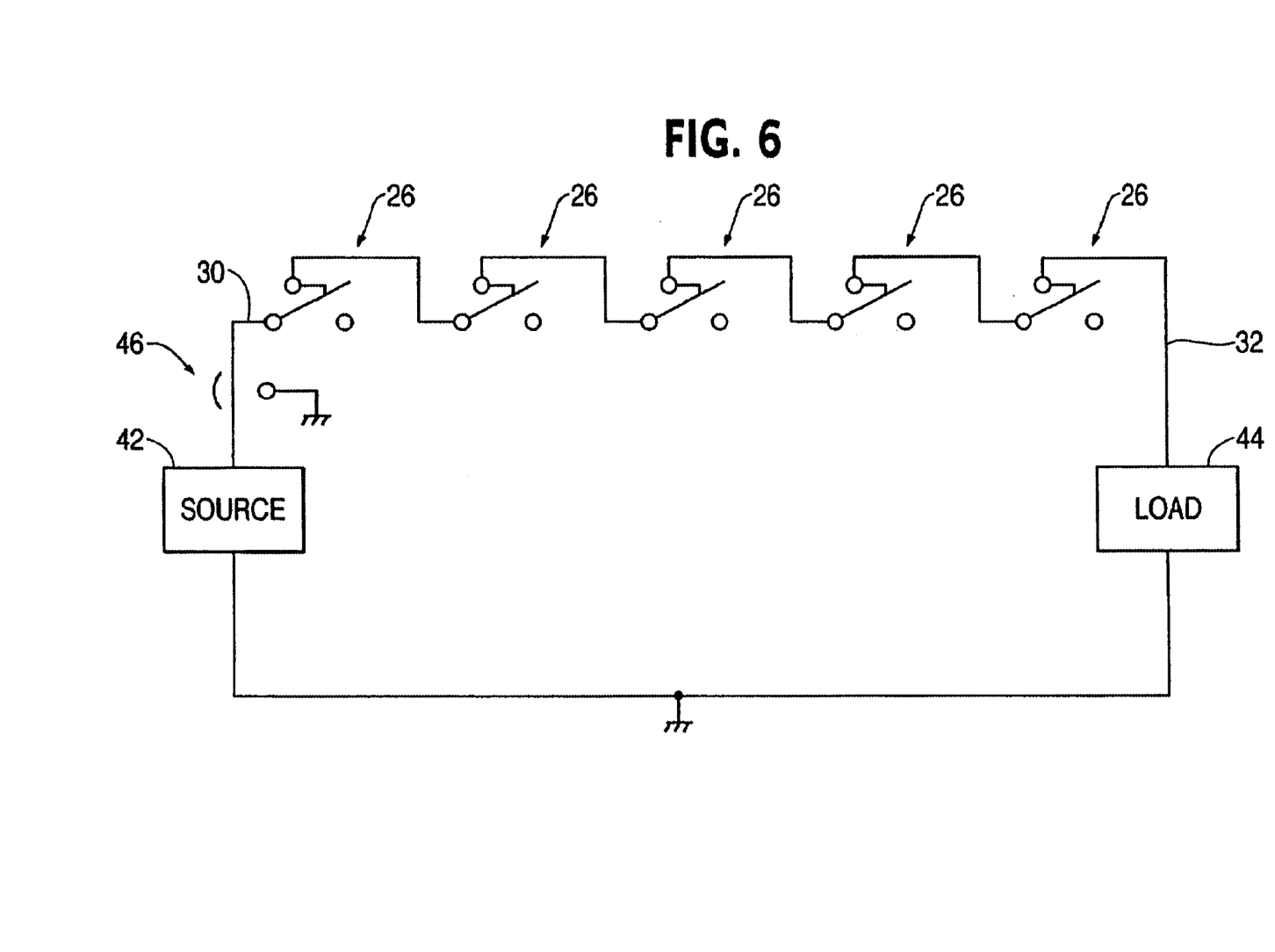
FIG. 6 is a circuit diagram depicting an exemplary circuit of an arc simulating device in accordance with a preferred embodiment of the invention.

As depicted in FIG. 6, an exemplary circuit is depicted in which the arc simulator device of the present invention would be used. In this circuit, the five switches 26 of the arc simulator are connected in series with a source 42, a load 44, and an arc fault circuit interrupter 46. It is noted that the present inventive apparatus and method will work with either an alternating or direct current source.

When the arc simulator is moved the mercury in one or more of the switches 26 will temporarily displace and break the circuit. When this happens, the arc fault circuit interrupter will detect an arcing condition that is not normal and will trip its internal switch opening the circuit.

Figure 7:
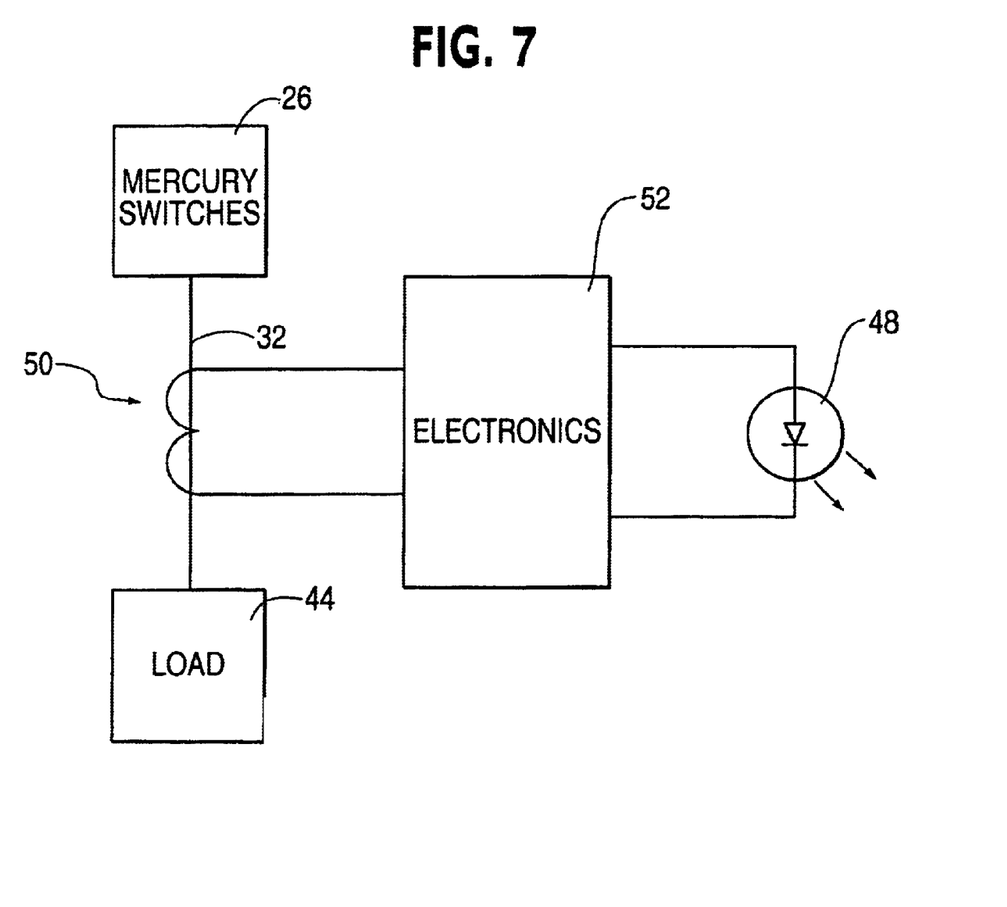
FIG. 7 is a circuit diagram depicting an exemplary current detecting and indicating circuit of an arc simulating device in accordance with a preferred embodiment of the invention.

As shown in FIG. 7, because the arcing is virtually transparent to the user, a light emitting diode indicator 48 may be used to verify current flow through the device. In the circuit of FIG. 7, as current flows through wire 32 a current is induced in the coil 50. This induced current is detected and the LED is driven by electronic circuit 52. Alternatively, the light emitting diode can indicate the absence of current flow through the device.

It is noted that to mimic series arcing, circuit interruptions should be chaotic and typically be one to two half cycles. In a four hundred hertz alternating current circuit, this would translate to 1.25 millisecond to 2.5 millisecond interruptions in the circuit. The arc simulator of the present invention can simulate such series arcing conditions through erratic movement of the housing on a level plane.

The present inventive apparatus and method are particularly useful in testing arc fault circuit interrupters during qualification, installation, and troubleshooting in an aircraft environment as the arcing conditions simulated by shaking the arc simulator are virtually identical to those experienced in aircraft when loose terminals are vibrated.

Although the present invention has been described with respect to an exemplary embodiment in which the arc simulator is moved on a planar surface, alternate embodiments can be readily developed which incorporate the same inventive features. For example, the desired results could also be achieved by providing a number of solenoids within the housing to cause vibrations of the housing and consequent displacement of the mercury in the switches. In this way, die device could be used in applications where a level surface is not available. Because the solenoids could be driven by computer software, optimized movements of the device could be developed and different types of arcing events could be simulated.

It should be readily recognized that the arc simulator of the present invention solves the safety and non-robust operation concerns present in the existing testing devices. In particular, because the circuit interruptions occur only within the enclosed, opaque, hermetically sealed switches 18, there is no exposed spark and the associated noxious fumes, heat, and intense light concerns. Further, through the use of switches of arcing terminals oxidation does not occur rendering the device useful throughout millions of cycles.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An arc simulating apparatus, comprising:
   a housing;
   a plurality of motion sensitive switches, connected in series and secured in said housing;
   a first terminal wire connected to a first pole of said plurality of switches; and
   a second terminal wire connected to a second pole of said plurality of switches.

2. The arc generating apparatus of claim 1, wherein said switches are mercury switches.

3. The arc generating apparatus of claim 1, wherein said switches are ball-tilt switches.

4. The arc generating apparatus of claim 1, wherein said switches are radially distributed within the housing and are each mounted at an angle to the base of said housing.

5. The arc generating apparatus of claim 4, wherein each of said angles is greater than thirty degrees.

6. The arc generating apparatus of claim 5, wherein said plurality of switches is five.

7. The arc generating apparatus of claim 4, leveling device provided on said housing.

8. The arc generating apparatus of claim 7, wherein said leveling device is a leveling bubble.

9. The arc generating apparatus of claim 7, further comprising a display device for indicating a power on condition for the apparatus.

10. The arc generating apparatus of claim 9 wherein the display device is an LED.

11. A method of simulating an arc in a circuit, comprising the step of: moving a housing containing a plurality of motion sensitive switches, connected in series, to interrupt a current flow in a circuit containing an arc fault circuit interrupter.

12. The method of claim 11, further comprising the step of leveling said housing.

13. The method of claim 11 further comprising the steps of connecting a first terminal wire of said plurality of switches to a current source and connecting a second terminal wire of said plurality of switches to a load.

14. The method of claim 11, wherein the plurality of switches are mercury switches.

15. The method of claim 11, wherein the plurality of switches are ball-tilt switches.

16. An apparatus for simulating an arc, comprising:
a plurality of means for interrupting a circuit in response to movement, said plurality of circuit interrupting means connected in series;
means for securing said circuit interrupting means, said securing means being moveable;
first means for electrically connecting said plurality of circuit interrupting means to a circuit to be tested; and
second means for electrically connecting said plurality of circuit interrupting means to a circuit to be tested.

17. The apparatus of claim 16, wherein said circuit interrupting means are radially distributed within said securing means.

18. The apparatus of claim 17, further comprising a means for leveling said securing means on said plane.

19. The apparatus of claim 17, further comprising means for signaling a power on condition for said circuit interrupting means.

20. The apparatus of claim 19, wherein said plurality of circuit interrupting means is five.

\* \* \* \* \*